(12) United States Patent
Tanaka

(10) Patent No.: US 6,956,393 B1
(45) Date of Patent: Oct. 18, 2005

(54) SOURCE CURRENT MEASUREMENT APPARATUS AND TEST APPARATUS

(75) Inventor: Hironori Tanaka, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/854,688

(22) Filed: May 26, 2004

(51) Int. Cl.$^7$ .............................................. G01R 31/02
(52) U.S. Cl. ..................................................... 324/763
(58) Field of Search ............................ 324/158.1, 763, 324/765; 714/733, 734, 735

(56) References Cited

U.S. PATENT DOCUMENTS

| | | | |
|---|---|---|---|
| 5,101,153 A * | 3/1992 | Morong, III ................. | 324/537 |
| 6,275,023 B1 * | 8/2001 | Oosaki et al. ............ | 324/158.1 |
| 6,404,220 B1 * | 6/2002 | Hashimoto .................... | 324/765 |
| 6,781,364 B2 * | 8/2004 | Kawasaki et al. ........ | 324/158.1 |
| 6,836,136 B2 * | 12/2004 | Aghaeepour ................ | 324/765 |

* cited by examiner

Primary Examiner—Vinh Nguyen
Assistant Examiner—Tung X. Nguyen
(74) Attorney, Agent, or Firm—Osha-Liang LLP

(57) ABSTRACT

A source current measurement apparatus for supplying a source voltage to an electronic device and measuring a source current supplied to the electronic device includes a reference voltage generating unit for generating a reference voltage, a supply unit for generating the source voltage based on the reference voltage and supplying the source voltage to the electronic device, wherein the supply unit is provided between the reference voltage generating unit and the electronic device, a feedback unit for controlling magnitude of the reference voltage generated by the reference voltage generating unit based on the source voltage applied to the electronic device, and a measurement unit for measuring the source current, wherein the supply unit includes a first differential amplifier for outputting the source voltage corresponding to a differential between the reference voltage and a predetermined comparison voltage and a second differential amplifier for generating the comparison voltage corresponding to the source voltage outputted by the first differential amplifier and supplying the comparison voltage to the first differential amplifier.

8 Claims, 6 Drawing Sheets

SOURCE CURRENT MEASUREMENT APPARATUS AND TEST APPARATUS

BACKGROUND OF THE INVENTION

1. Field of the Invention

The present invention relates to a source current measurement apparatus is for applying a source voltage to an electronic device and measuring the source current supplied to the electronic device and a test apparatus using the source current measurement apparatus.

2. Description of the Related Art

In the conventional test of an electronic device such as a semiconductor circuit, a source current supplied to the electronic device used to be measured. For example, a predetermined source voltage is applied to the electronic device, and the source current is measured at that time, so that the quality of the electronic device is judged on the basis of the source current measured.

FIG. 1 shows the configuration of a conventional measurement apparatus 200. The measurement apparatus 200, which supplies a source voltage to an electronic device 300 and measures the source current supplied to the electronic device 300 at that time, includes a power source 202, a resistor 204, an amplifier 206, a resistor 208, a buffer 210, a current amplifier 212, an AD converter 214, an amplifier 216, a resistor 218, and a capacitor 220.

The voltage generated by the power source 202 is supplied to the non-inverting input of the amplifier 206 via the resistor 204. And the current amplifier 212 generates a source voltage corresponding to the voltage outputted by the amplifier 206 and supplies it to the electronic device 300 via the resistor 218. Here, by supplying the AD converter 214 with the voltage difference between both ends of the resistor 218 via the amplifier 216, the source current supplied to the electronic device 300 is measured. And the buffer 210 and the resistor 208 feed back the source voltage supplied to the electronic device 300 to the non-inverting input of the amplifier 206 so as to control the source voltage to be a predetermined value, and the capacitor 220 restricts the change of the source voltage.

In the conventional measurement apparatus 200, as an example of the current amplifier 212, a bipolar transistor is used, where a predetermined direct voltage is applied between the emitter and the collector of the bipolar transistor, the output voltage of the amplifier 206 is applied to the base, and the emitter terminal is coupled to the resistor 218.

FIG. 2 shows the changes of the source voltage $V_O$ and the source current $I_L$. As shown in FIG. 2, when the source current $I_L$ changes, the source voltage $V_O$ changes in response to the change of the current. At this time, it is preferable that the recovery time $\Delta t$ of the change of the source voltage $V_O$ should be small. In the conventional measurement apparatus 200 as described in connection with FIG. 1, however, the source voltage is generated using the amplifier 212, so the recovery time $\Delta t$ becomes large.

In order to solve the above problem, a voltage controlled amplifier using a capacitor of large capacitance as the capacitor 220 is used in place of the current amplifier 212. Since the capacitor 220 of large capacitance is controlled by the voltage controlled amplifier at a high speed, the recovery time $\Delta t$ can be reduced.

FIG. 3 shows the configuration of the voltage controlled amplifier. The voltage controlled amplifier includes a pnp transistor 56 and an npn transistor 58 provided in series with resistors 54 and 60 between two different direct voltages (V1 and V2), and voltages corresponding to a reference voltage are applied to the base terminals of the pnp transistor 56 and the npn transistor 58 via a resistor 47, diodes 48 and 50, and a resistor 52 provided in series between the two different direct voltages (V1 and V2). By the above configuration, the source voltage is outputted from the connection point between the pnp transistor 56 and the npn transistor 58.

In the above voltage controlled amplifier, a plurality of diodes or transistors are used, so the deviation in the characteristics of the elements included in the voltage controlled amplifier is liable to occur, and the source voltage cannot be generated with high precision.

And in case that a large source current is supplied to the electronic device 300, the voltage controlled amplifiers may be provided in parallel. In the test of the source current in that case, it is necessary to detect the output current outputted by each of the voltage controlled amplifiers and calculate the sum of the output currents. However, it is undesirable that the circuit size increases due to the operational amplifier circuits. And although it is possible to reduce the increase of the circuit size by detecting the output current of any of the voltage controlled amplifiers and the source current by multiplying the number of the voltage controlled amplifiers provided in parallel, the deviation occurs in the output current of each of the voltage controlled amplifiers due to the element variation or temperature variation described above, so the source current cannot be detected with high precision.

SUMMARY OF THE INVENTION

Therefore, it is one objects of the present invention to provide a source current measurement apparatus and a test apparatus, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a source current measurement apparatus for supplying a source voltage to an electronic device and measuring a source current supplied to the electronic device includes a reference voltage generating unit for generating a reference voltage, a supply unit for generating the source voltage based on the reference voltage and supplying the source voltage to the electronic device, wherein the supply unit is provided between the reference voltage generating unit and the electronic device, a feedback unit for controlling magnitude of the reference voltage generated by the reference voltage generating unit based on the source voltage applied to the electronic device, and a measurement unit for measuring the source current, wherein the supply unit includes a first differential amplifier for outputting the source voltage corresponding to a differential between the reference voltage and a predetermined comparison voltage and a second differential amplifier for generating the comparison voltage corresponding to the source voltage outputted by the first differential amplifier and supplying the comparison voltage to the first differential amplifier.

The source current measurement apparatus may further include a plurality of the supply units provided in parallel between the reference voltage generating unit and the electronic device, wherein the measurement unit may measure the source current by detecting an output current outputted by the first differential amplifier of one of the supply units according to the comparison voltage outputted by the second differential amplifier of the one of supply units and multiplying the output current by a coefficient corresponding to a number of the supply units provided in parallel. Each of the supply units may further include a current detecting unit for detecting the output current outputted by the first differential amplifier, and the second differential amplifier may generate the comparison voltage corresponding to the output current.

The current detecting unit may include a current detecting resistor provided in series between the first differential amplifier and the electronic device, and the second differential amplifier may generate the comparison voltage corresponding to a voltage difference between both ends of the current detecting resistor.

The source current measurement apparatus may further include a clamp unit for restricting magnitude of the reference voltage generated by the reference voltage generating unit based on the comparison voltage outputted by the second differential amplifier of the supply unit. The source current measurement apparatus may further include a clamp unit for restricting magnitude of the reference voltage generated by the reference voltage generating unit based on the comparison voltage outputted by the second differential amplifier of one of the supply units.

According to the second aspect of the present invention, a test apparatus for testing an electronic device includes a source current measurement apparatus for supplying a source voltage to the electronic device and measuring a source current supplied to the electronic device and a judgment unit for judging quality of the electronic device based on the source current measured by the source current measurement apparatus, wherein the source current measurement apparatus includes a reference voltage generating unit for generating a reference voltage, a supply unit for generating the source voltage based on the reference voltage and supplying the source voltage to the electronic device, wherein the supply unit is provided between the reference voltage generating unit and the electronic device, a feedback unit for controlling magnitude of the reference voltage generated by the reference voltage generating unit based on the source voltage applied to the electronic device, and a measurement unit for measuring the source current, and the supply unit includes a first differential amplifier for outputting the source voltage corresponding to a differential between the reference voltage and a given comparison voltage and a second differential amplifier for generating the comparison voltage corresponding to the source voltage outputted by the first differential amplifier and supplying the comparison voltage to the first differential amplifier.

The source current measurement apparatus may further include a plurality of the supply units provided in parallel between the reference voltage generating unit and the electronic device, and the measurement unit may measure the source current by detecting an output current outputted by the first differential amplifier of one of the supply units according to the comparison voltage outputted by the second differential amplifier of the one of supply units and multiplying the output current by a coefficient corresponding to a number of the supply units provided in parallel.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 4:
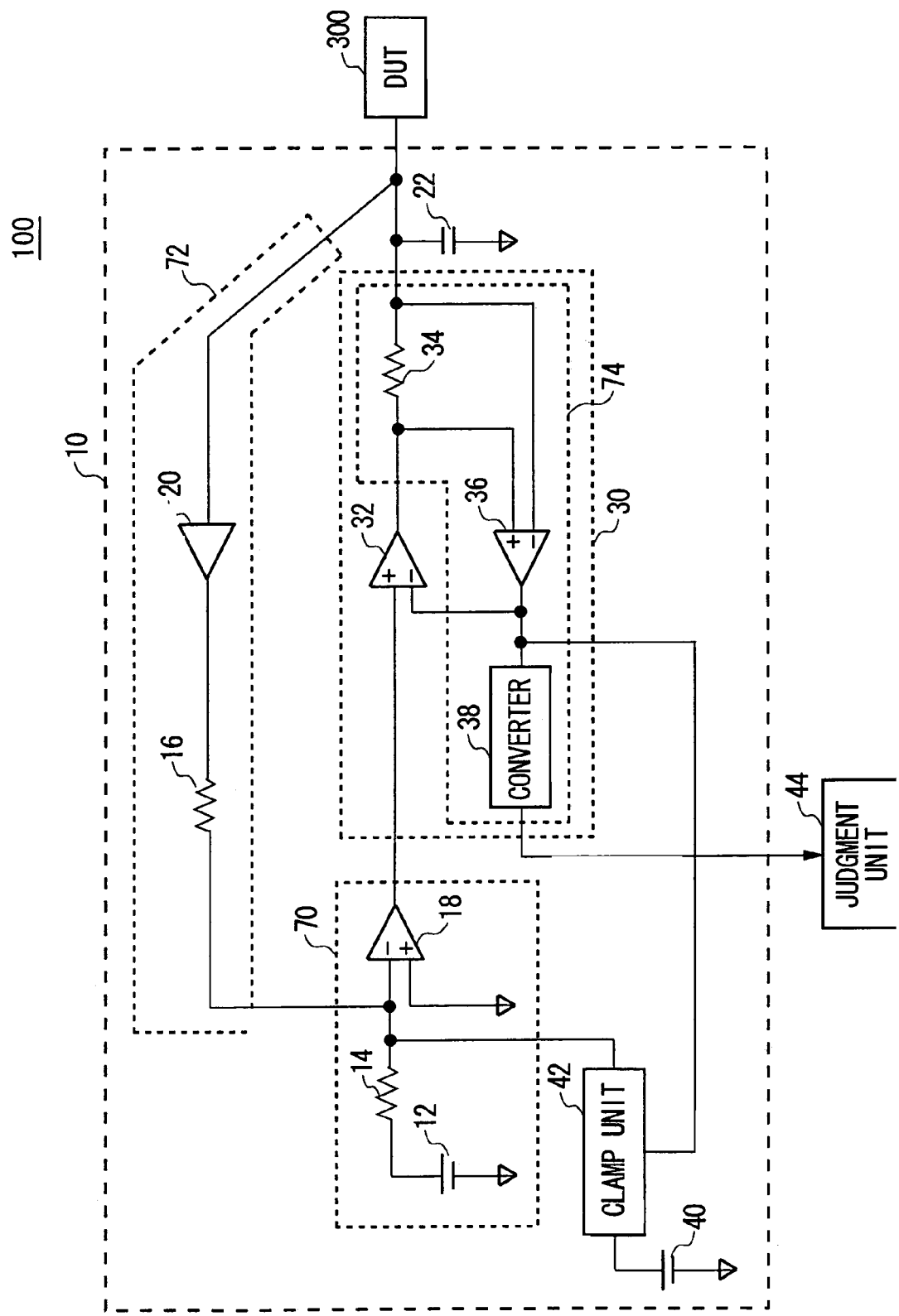
FIG. 4 shows an example of the configuration of a test apparatus 100 according to an exemplary embodiment of the present invention.

FIG. 4 shows an example of the configuration of a test apparatus 100 according to an exemplary embodiment of the present invention. The test apparatus 100, which supplies a source voltage to an electronic device 300 and judges the quality of the electronic device 300 based on the source current supplied to the electronic device 300 at that time, includes a source current measurement apparatus 10 and a judgment unit 44.

The source current measurement apparatus 10, which supplies the source voltage to the electronic device 300 and measures the source current supplied to the electronic device 300, includes a reference voltage generating unit 70, a supply unit 30, a feedback unit 72, a capacitor 22, a clamp unit 42, and a power source 40.

The reference voltage generating unit 70 generates a reference voltage of a predetermined value, including a power source 12, a resistor 14, and an amplifier 18. The power source 12 generates a predetermined voltage. And the amplifier 18, which is a differential amplifier, receives the voltage generated by the power source 12 via the resistor 14 in its inverting input and is grounded at its non-inverting input. That is, the amplifier 18 outputs the reference voltage corresponding to the voltage generated by the power source 12.

The supply unit 30, which is provided between the reference voltage generating unit 70 and the electronic device 300, generates the source voltage based on the reference voltage and supplies it to the electronic device 300. The supply unit 30 of this embodiment includes a first differential amplifier 32 and a current detecting unit 74.

The first differential amplifier 32 outputs the source voltage described above in response to the differential between the reference voltage and a comparison voltage given by the current detecting unit 74. In this embodiment, the reference voltage generated by the reference voltage generating unit 70 is applied to the non-inverting input of the first differential amplifier 32, and the comparison voltage is applied to the inverting input thereof from the current detecting unit 74.

The current detecting unit 74, which is a circuit for detecting the output current outputted by the first differential amplifier 32, includes a current detecting resistor 34, a second differential amplifier 36, and a converter 38. The current detecting resistor 34 is provided in series between the first differential amplifier 32 and the electronic device 300. That is, the current detecting resistor 34 conducts the source current supplied to the electronic device 300.

The second differential amplifier 36 generates the comparison voltage corresponding to the source voltage outputted by the first differential amplifier 32 and supplies it to the inverting input of the first differential amplifier 32. In this embodiment, the second differential amplifier 36 detects the output current outputted by the first differential amplifier 32 in response to the voltage difference between both ends of the current detecting resistor 34 and outputs the comparison voltage corresponding to the output voltage.

Figure 1:
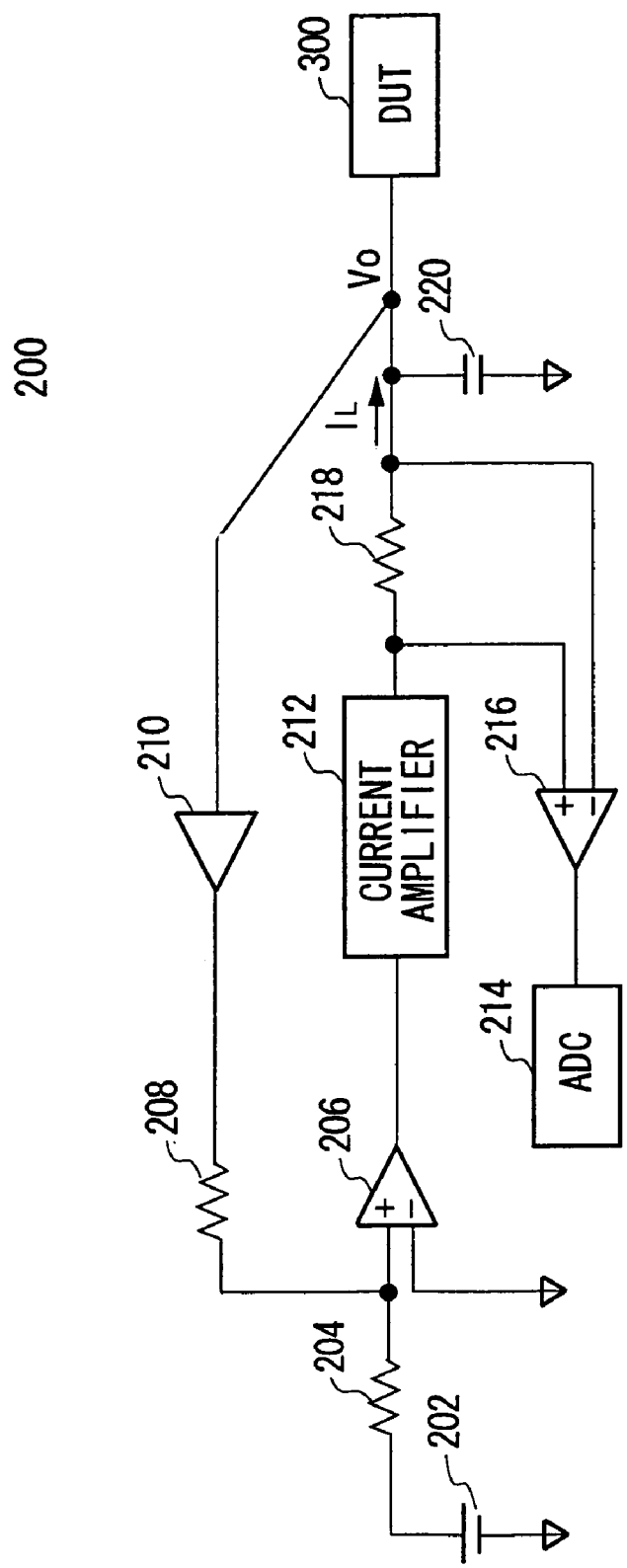
FIG. 1 shows the configuration of a conventional measurement apparatus 200.
Figure 2:
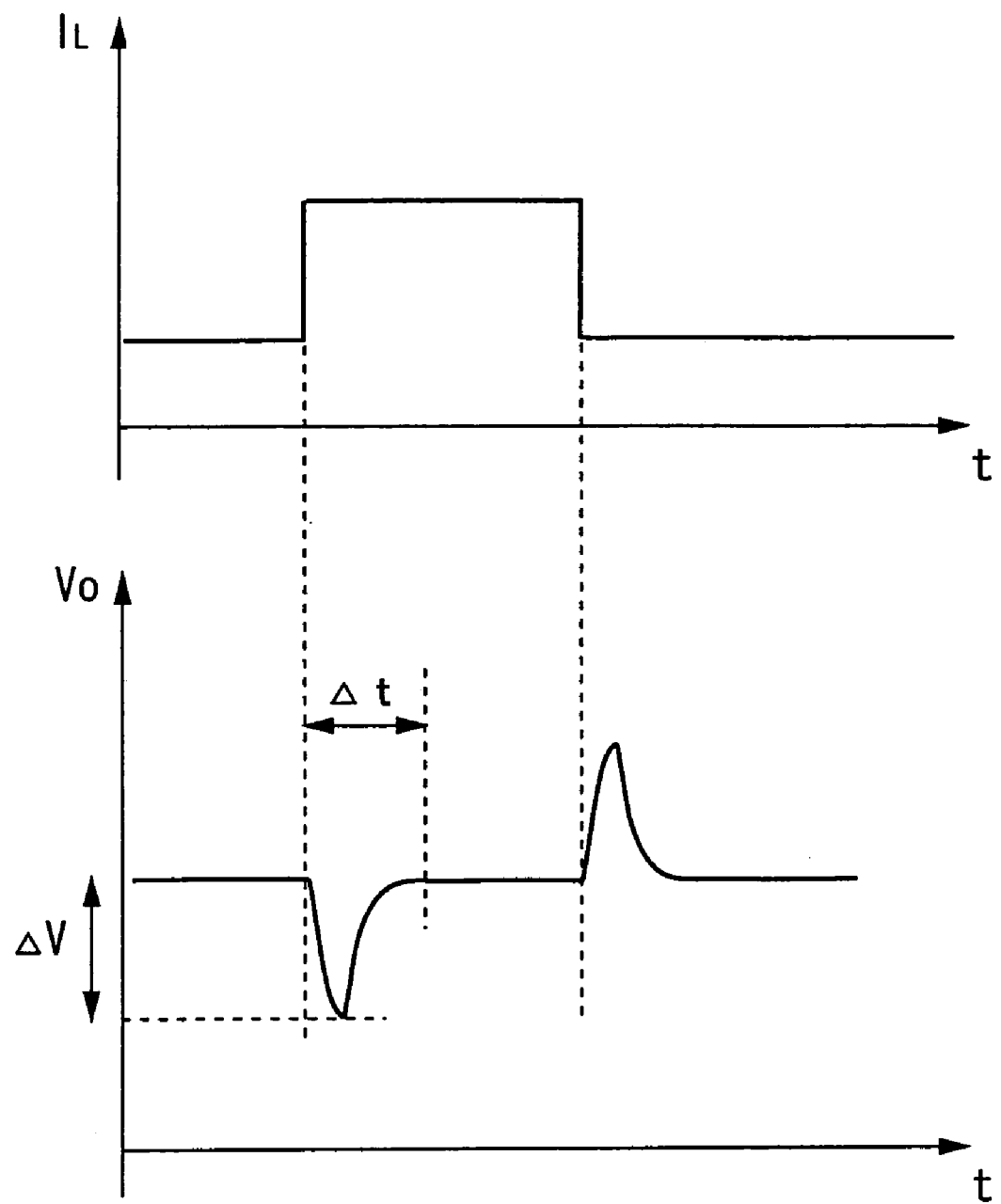
FIG. 2 shows the changes of a source voltage $V_O$ and a source current $I_L$.
Figure 3:
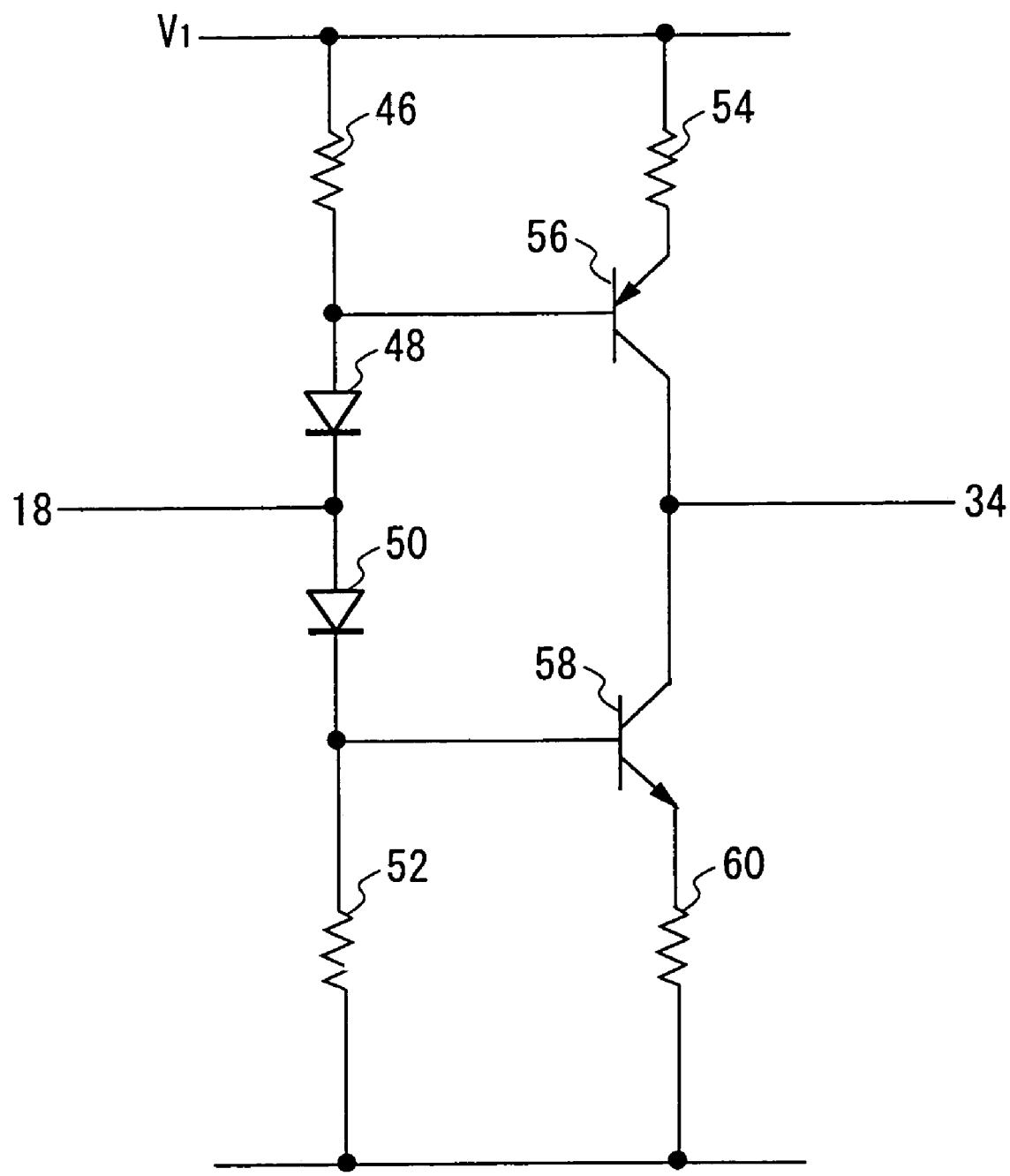
FIG. 3 shows the configuration of a voltage controlled amplifier.

By the above configuration, it is possible to generate the source voltage and the source current with high precision as compared with one voltage controlled amplifier used in the supply unit 30 described above in connection with FIG. 3.

And the converter 38 detects the source current flowing in the current detecting unit 34 based on the comparison voltage outputted by the second differential amplifier 36. For example, the converter 38 may be an analog-digital converter.

The capacitor 22 is provided between the output terminal of the supply unit 30 and the ground and restricts the change of the source voltage. And the feedback unit 72 controls the magnitude of the reference voltage generated by the reference voltage generating unit 70 based on the source voltage applied to the electronic device 300. The feedback unit 72 of this embodiment feeds back the source voltage outputted by the supply unit 30 to the non-inverting input of the amplifier 18 and controls the reference voltage so that the source voltage can be a predetermined magnitude. The feedback unit 72 feeds back the source voltage to the amplifier 18 via the buffer 20 and the resistor 16.

And the clamp unit 42 restricts the magnitude of the reference voltage generated by the reference voltage generating unit 70 based on the comparison voltage outputted by the differential amplifier 36 of the supply unit 30. That is, the clamp unit 42 restricts the magnitude of the source current supplied to the electronic device 300 to be less than a predetermined value by restricting the magnitude of the reference voltage in response to the result of comparing the voltage applied from the power source 40 and the comparison voltage. Accordingly, it is possible to prevent the electronic device 300 from being supplied with an excessive source current.

The judgment unit 44 judges the quality of the electronic device 300 based on the source current measured by the source current measurement apparatus 10. For example, the judgment unit 44 may judge the quality of the electronic device 300 based on whether the source current is within a predetermined range or not.

Figure 5:
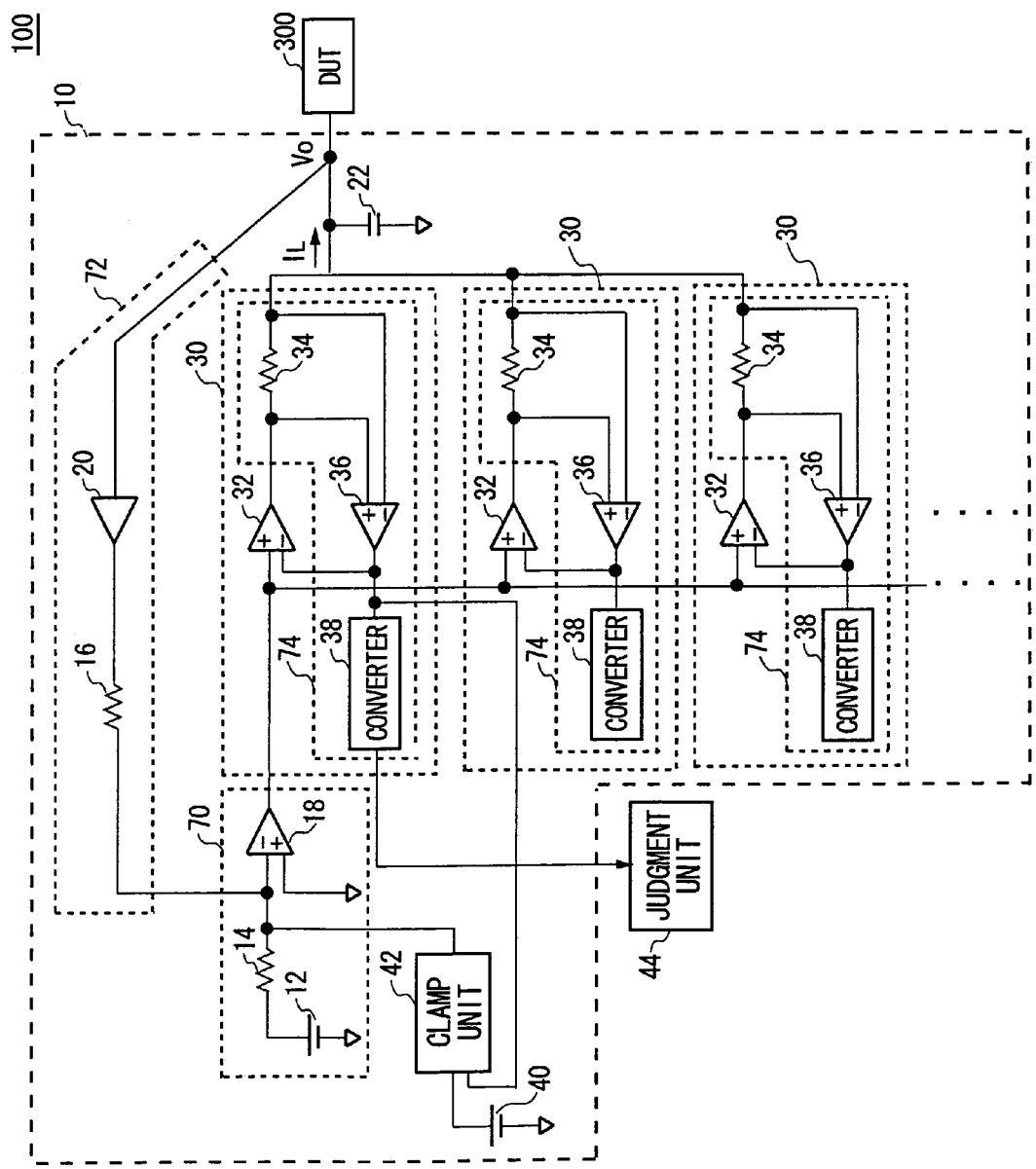
FIG. 5 shows another example of the configuration of the test apparatus 100.

FIG. 5 shows another example of the configuration of the test apparatus 100. The test apparatus 100 of this embodiment has a different configuration from that of the test apparatus 100 described above 100 in connection with FIG. 4 in that it includes a plurality of supply units 30. In other configurations, it is the same as the test apparatus 100 described above 100 in connection with FIG. 4, so the configurations will not be described. And the plurality of supply units 30 have the same or similar function and configuration with the supply unit 30 described above 100 in connection with FIG. 4.

The plurality of supply units 30 are provided in parallel between the reference voltage 70 and the electronic device 300. Each of the supply units 30 generates approximately the same source voltage and output current corresponding to the reference voltage generated by the reference voltage generating unit 70. By the configuration, it is possible to prevent the electronic device from being supplied with an excessive source current.

And the judgment unit 44 may function as a measurement unit for detecting the source current supplied to the electronic device 300. The judgment unit 44 measures the source current by detecting the output current outputted by the first differential amplifier 32 of one of the supply units 30 according to the comparison voltage outputted by the second differential amplifier 36 of the concerning supply unit 30 and multiplying the detected output voltage by the coefficient correspond to the number of the supply units 30 provided in parallel. For example, if the source current is supplied from the supply units 30 whose number is n (n is an integer), the value that results from multiplying the output voltage detected from one of the supply units 30 by n is calculated as the source current.

Since each of the supply units 30 can generate its output current with high precision as described above, the deviation in each output current becomes small. Accordingly, by multiplying the output current generated by one of the supply units 30 by an integer, it is possible to detect the source current with high precision. In addition, it is possible to detect the source current using a small-sized circuit as compared with calculating the sum of the output voltages generated by every supply unit 30.

And the clamp unit 42 of this embodiment restricts the magnitude of the reference voltage generated by the reference voltage generating unit 70 based on the comparison voltage outputted by the second differential amplifier 36 of one of the supply units 30. In this case, it is preferable that the clamp unit 42 and the judgment unit 44 should operate based on the comparison voltage of the same supply unit 30. By the above configuration, it is possible to highly precisely restrict the source current using a small-sized circuit.

Figure 6:
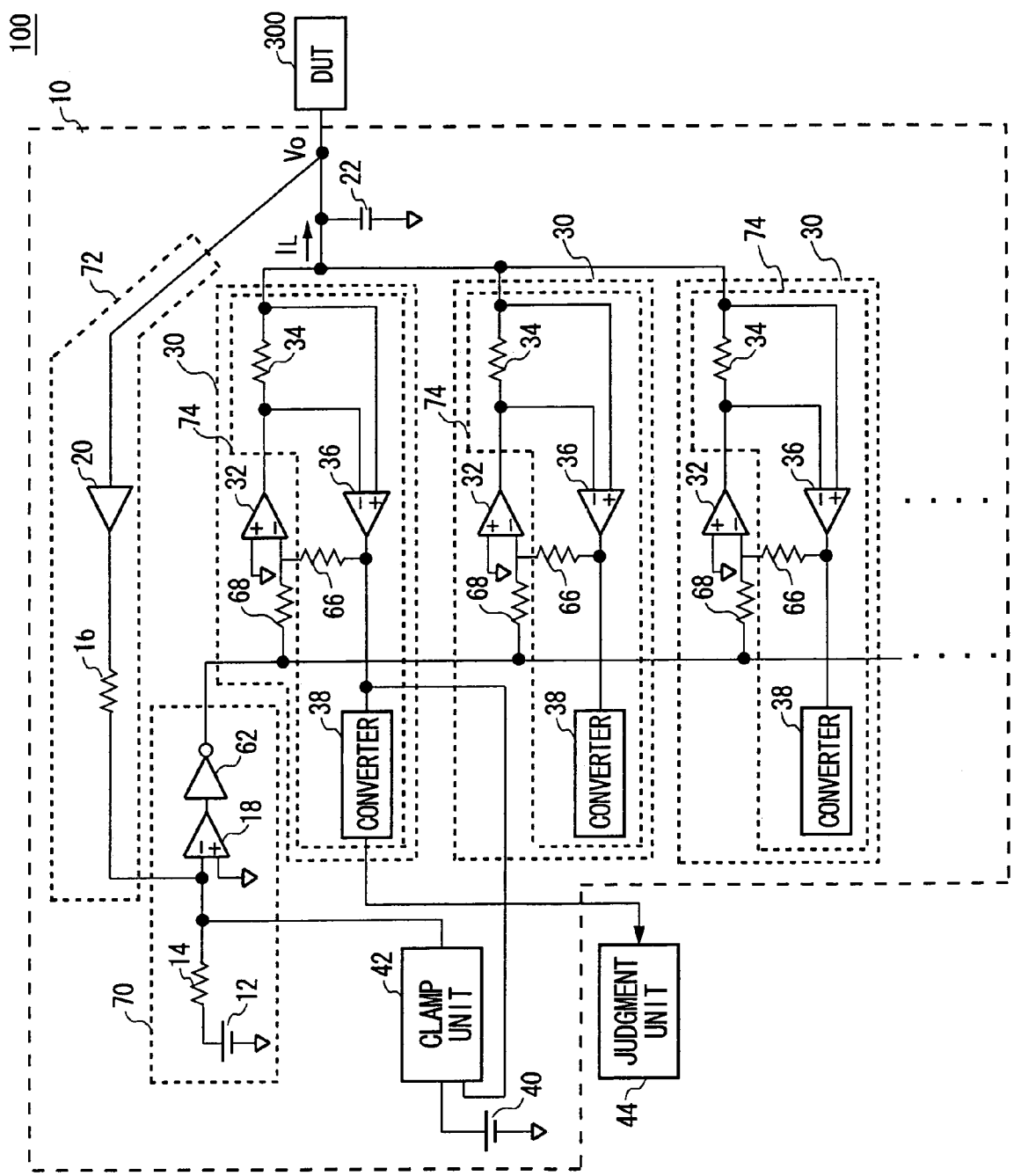
FIG. 6 shows further another example of the configuration of the test apparatus 100.

FIG. 6 shows further another example of the configuration of the test apparatus 100. The test apparatus 100 of this embodiment further includes an inverting buffer 62 in the reference voltage generating unit 70 in addition to the configuration of the test apparatus 100 described above in connection with FIG. 5.

And in this embodiment, each of the first differential amplifiers 32 receives the reference voltage inverted via a resistor 68 in its inverting input and is grounded at its non-inverting input. And the comparison voltage outputted by each of the second differential amplifiers 36 is inputted to the non-inverting input of the corresponding first differential amplifier 32 via a resistor 66.

By this configuration, like the test apparatus 100 described above in connection with FIG. 5, it is possible to highly precisely detect the source current using a small-sized circuit.

As obvious from the description above, according to the present invention, it is possible to generate the source voltage and the source current with high precision. And although a plurality of supply units are provided in parallel to supply the electronic device with a large source current, it is possible to highly precisely detect the source current using a small-sized circuit.

Although the present invention has been described by way of exemplary embodiments, it should be understood that those skilled in the art might make many changes and substitutions without departing from the spirit and the scope of the present invention which is defined only by the appended claims.

What is claimed is:

1. A source current measurement apparatus for supplying a source voltage to an electronic device and measuring a source current supplied to said electronic device, comprising:
   a reference voltage generating unit for generating a reference voltage;
   a supply unit for generating said source voltage based on said reference voltage and supplying said source voltage to said electronic device, wherein said supply unit is provided between said reference voltage generating unit and said electronic device;
   a feedback unit for controlling magnitude of said reference voltage generated by said reference voltage generating unit based on said source voltage applied to said electronic device; and
   a measurement unit for measuring said source current, wherein said supply unit comprises:
   a first differential amplifier for outputting said source voltage corresponding to a differential between said reference voltage and a predetermined comparison voltage; and
   a second differential amplifier for generating said comparison voltage corresponding to said source voltage outputted by said first differential amplifier and supplying said comparison voltage to said first differential amplifier.

2. A source current measurement apparatus as claimed in claim 1 further comprising a plurality of said supply units provided in parallel between said reference voltage generating unit and said electronic device,
   wherein said measurement unit measures said source current by detecting an output current outputted by said first differential amplifier of one of said supply units according to said comparison voltage outputted by said second differential amplifier of said one of supply units and multiplying said output current by a coefficient corresponding to a number of said supply units provided in parallel.

3. A source current measurement apparatus as claimed in claim 2, wherein each of said supply units further comprises a current detecting unit for detecting said output current outputted by said first differential amplifier, and said second differential amplifier generates said comparison voltage corresponding to said output current.

4. A source current measurement apparatus as claimed in claim 3, wherein said current detecting unit comprises a current detecting resistor provided in series between said first differential amplifier and said electronic device, and said second differential amplifier generates said comparison voltage corresponding to a voltage difference between both ends of said current detecting resistor.

5. A source current measurement apparatus as claimed in claim 1 further comprising a clamp unit for restricting magnitude of said reference voltage generated by said reference voltage generating unit based on said comparison voltage outputted by said second differential amplifier of said supply unit.

6. A source current measurement apparatus as claimed in claim 2 further comprising a clamp unit for restricting magnitude of said reference voltage generated by said reference voltage generating unit based on said comparison voltage outputted by said second differential amplifier of one of said supply units.

7. A test apparatus for testing an electronic device, comprising:
   a source current measurement apparatus for supplying a source voltage to said electronic device and measuring a source current supplied to said electronic device; and
   a judgment unit for judging quality of said electronic device based on said source current measured by said source current measurement apparatus,
wherein said source current measurement apparatus comprises:
   a reference voltage generating unit for generating a reference voltage;
   a supply unit for generating said source voltage based on said reference voltage and supplying said source voltage to said electronic device, wherein said supply unit is provided between said reference voltage generating unit and said electronic device;
   a feedback unit for controlling magnitude of said reference voltage generated by said reference voltage generating unit based on said source voltage applied to said electronic device; and
   a measurement unit for measuring said source current, and said supply unit comprises:
   a first differential amplifier for outputting said source voltage corresponding to a differential between said reference voltage and a given comparison voltage; and
   a second differential amplifier for generating said comparison voltage corresponding to said source voltage outputted by said first differential amplifier and supplying said comparison voltage to said first differential amplifier.

8. A test apparatus as claimed in claim 7, wherein said source current measurement apparatus further comprises a plurality of said supply units provided in parallel between said reference voltage generating unit and said electronic device, and said measurement unit measures said source current by detecting an output current outputted by said first differential amplifier of one of said supply units according to said comparison voltage outputted by said second differential amplifier of said one of supply units and multiplying said output current by a coefficient corresponding to a number of said supply units provided in parallel.

* * * * *